United States Patent [19]

Thelen, Jr.

[11] Patent Number: 5,231,316

[45] Date of Patent: Jul. 27, 1993

[54] TEMPERATURE COMPENSATED CMOS VOLTAGE TO CURRENT CONVERTER

[75] Inventor: Donald C. Thelen, Jr., Pullman, Wash.

[73] Assignee: Lattice Semiconductor Corporation, Hillsboro, Oreg.

[21] Appl. No.: 853,453

[22] Filed: Mar. 17, 1992

Related U.S. Application Data

[63] Continuation-in-part of Ser. No. 785,443, Oct. 29, 1991.

[51] Int. Cl.$^5$ ............................................. G06G 7/10
[52] U.S. Cl. .................................. 307/491; 307/310; 307/202.1
[58] Field of Search ............ 307/310, 491, 494, 296.6, 307/296.8, 202.1

[56] References Cited

U.S. PATENT DOCUMENTS

| | | | |
|---|---|---|---|
| 3,705,316 | 12/1972 | Burrous et al. | 307/310 |
| 3,980,963 | 9/1976 | Doi | 307/310 |
| 4,004,462 | 1/1977 | Dobkin | 307/310 |
| 4,582,659 | 4/1986 | Hilgers | 264/61 |
| 4,730,128 | 3/1988 | Seki | 307/310 |

OTHER PUBLICATIONS

Article entitled "A Floating CMOS Bandgap Reference Voltage for Differential Applications", by M. Ferro et al., published in the IEEE Journal of Solid State Circuits, vol. SC-24, pp. 690-697.

Article entitled "A New NMOS Temperature-Stable Voltage Reference" by R. Blauschild et al., published in the IEEE Journal of Solid-State Circuits, vol. SC-13, pp. 767-773, Dec. 1978.

Pp. 736-737 from the book entitled *Analysis and Design of Analog Integrated Circuits*, second edition, by P. R. Gray and R. E. Meyer, published by John Wiley and Sons, New York, N.Y., 1984.

*Primary Examiner*—William L. Sikes
*Assistant Examiner*—Toan Tran
*Attorney, Agent, or Firm*—Skjerven, Morrill, MacPherson, Franklin & Friel

[57] ABSTRACT

A voltage to current converter circuit is provided which outputs a constant current independent of temperature. The temperature coefficient of a first on-chip impedance network is canceled by a threshold voltage of a transistor which has a temperature coefficient that tracks the temperature coefficient of the first impedance network. The magnitude of the output current is adjustable using the first impedance network, and does not affect the temperature coefficient. A second impedance network effectively zeros out the temperature coefficient of the circuit by adjusting an input reference voltage assumed to have a first order temperature coefficient.

41 Claims, 9 Drawing Sheets

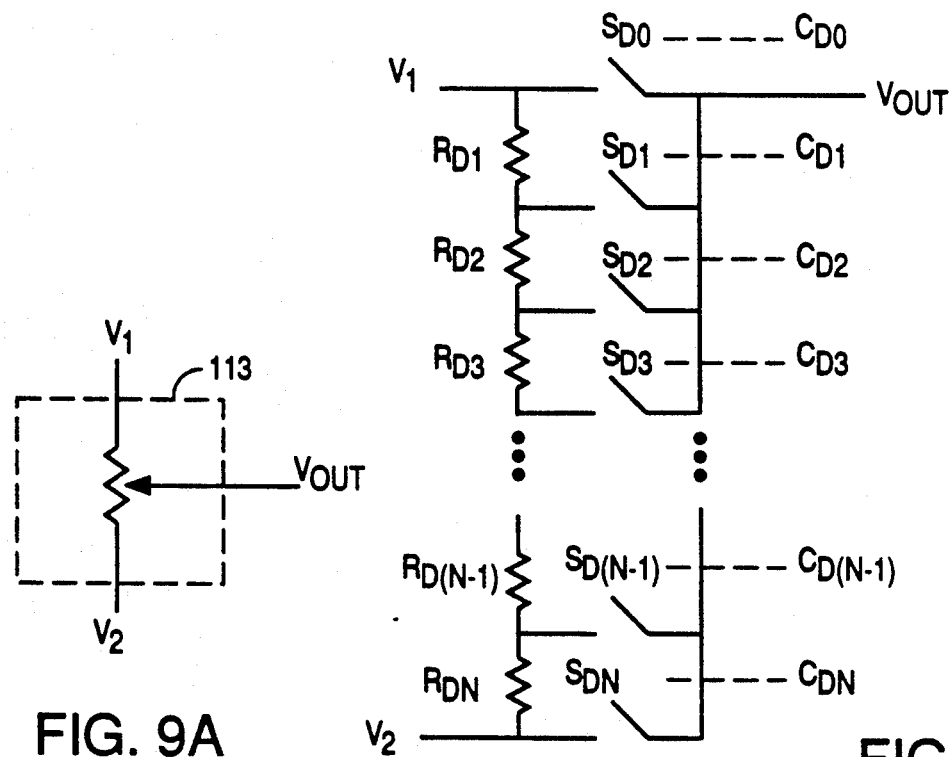
FIG. 9A
FIG. 9B
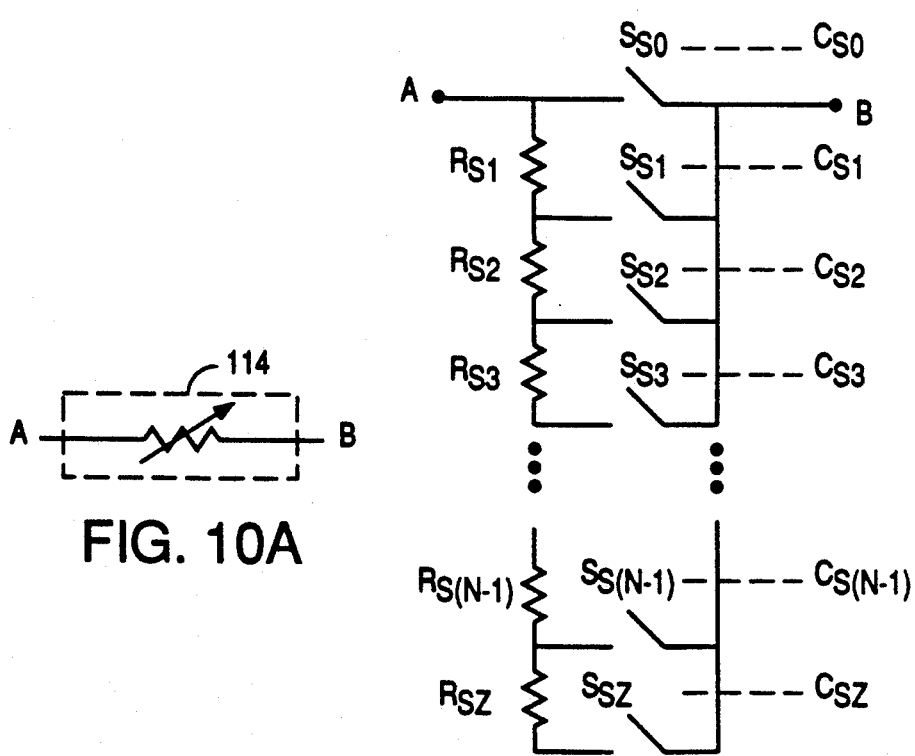
FIG. 10A
FIG. 10B

TEMPERATURE COMPENSATED CMOS VOLTAGE TO CURRENT CONVERTER

CROSS-REFERENCE TO RELATED APPLICATION

This application is a continuation-in-part of U.S. patent application Ser. No. 07/785,443, filed Oct. 29, 1991 by Donald C. Thelen, Jr., entitled "Temperature Compensated CMOS Voltage To Current Converter".

FIELD OF THE INVENTION

The present invention relates to a CMOS voltage to current convertor and, in particular, to a circuit which outputs a fixed current independent of temperature, voltage, and process, and which also is tunable.

BACKGROUND OF THE INVENTION

Voltage to current converters which compensate for a temperature coefficient are well known in the art. For example, referring to FIG. 1, one version of a voltage to current converter (hereinafter circuit 10), described in *Analysis and Design of Analog Integrated Circuits*, 2nd Edition, by P. R. Grey and R. E. Meyer, (1977, 1980), has a reference voltage $V_{REF}$ applied to line 1 which is coupled to the positive input terminal of operational amplifier 2. The output line 3 of operational amplifier 2 is connected to the gate G of N-channel transistor 9. Feedback loop 6 couples the source S of transistor 9 to the negative input terminal of operational amplifier 2. Source S is also coupled to resistor R which is grounded. The output current $I_{OUT}$ is provided on line 5 which is coupled to the drain D of transistor 9. Voltage to current conversion is accomplished by maintaining reference voltage $V_{REF}$ across resistor R using operational amplifier 2. By definition, the voltage $V_{REF}$ on line 1, connected to the positive input of operational amplifier 2, will also appear at node 8. Circuit 10 will be independent of temperature only if resistor R and reference voltage $V_{REF}$ have the same temperature coefficient, i.e. are affected by temperature in a similar manner. Since, on silicon, the best resistor available has a temperature coefficient of approximately 0.1% per degree Celsius, it follows that $V_{REF}$ must have a similar temperature coefficient. In addition to the temperature coefficient, the value of resistor R and reference voltage $V_{REF}$ are also typically dependent on processing.

To compensate for the temperature coefficient of resistor R, voltage $V_{REF}$ must exhibit a temperature coefficient equal to that of resistor R. One way of achieving a variable reference voltage $V_{REF}$ which would compensate for the temperature coefficient of resistor R is through the use of a band-gap voltage reference circuit (not shown) connected to line 1. Band-gap voltage reference circuits require the use of bipolar transistors. However, in CMOS processing, bipolar transistors pose several disadvantages. First, CMOS processing typically provides "parasitic" (i.e. non-dedicated) bipolar devices, but their use requires an undesirable substrate current. Second, dedicated bipolar transistors require special processing which increases manufacturing cost and complexity. Conversely, bipolar transistors offer certain desirable characteristics, for example an exponential relationship between emitter current and base-emitter voltage, which allows a voltage to current converter to cover a wider range of currents with equal precision.

Therefore, a need arises for a voltage to current converter, either in full CMOS processing (i.e. without bipolar transistors) or with limited use of bipolar transistors, which compensates for a temperature coefficient.

SUMMARY OF THE INVENTION

In accordance with the present invention, a voltage to current converter is provided which outputs a current independent of temperature, operating supply voltage and process. Voltage to current conversion is accomplished by maintaining a reference voltage, assumed to be independent of operating supply voltage, but assumed to have a first order temperature coefficient (explained later in the Detailed Description), across an impedance network using an operational amplifier. Programmable taps in the impedance network tune the magnitude of the resistance (in the impedance network) to account for processing variations in the absolute value of this impedance. In one embodiment, electrically erasable programmable read only memory cells (EEPROM cells) are used as the programmable elements to control switches. To conserve memory bits, decoder circuitry is provided in one embodiment to control the switches of the impedance network.

A transistor is coupled between the operational amplifier and the impedance network to compensate for the combined temperature coefficient of the impedance network and the reference voltage. In one embodiment, a P-channel transistor effectively cancels this temperature coefficient. In another embodiment, a bipolar transistor provides the same function. In this manner, the magnitude of the output current is adjustable, and does not affect the temperature coefficient. To tune the temperature coefficient to zero, the magnitude of the reference voltage is adjusted using a second impedance network.

BRIEF DESCRIPTION OF THE DRAWINGS

FIGS. 9A and 9B show a representation of a tapped resistive voltage divider network and an embodiment of the same, respectively.

FIGS. 10A and 10B illustrate a representation of a tapped resistor network and an embodiment of the same, respectively.

DETAILED DESCRIPTION OF THE DRAWINGS

In accordance with the present invention, a reference voltage $V_{REF}$ is, for all practical purposes, assumed to be independent of a voltage supply, but is assumed to have a first order temperature coefficient. Additionally, reference voltage $V_{REF}$ may vary with process. For additional information regarding maintaining this reference voltage, reference is made to copending application Ser. No. 07/785,442, filed Oct. 29, 1991, entitled "Tunable Voltage Reference Circuit To Provide An Output Voltage With A Predetermined Temperature Coefficient Independent Of Variation In Supply Voltage", which is incorporated herein by reference.

Figure 2:
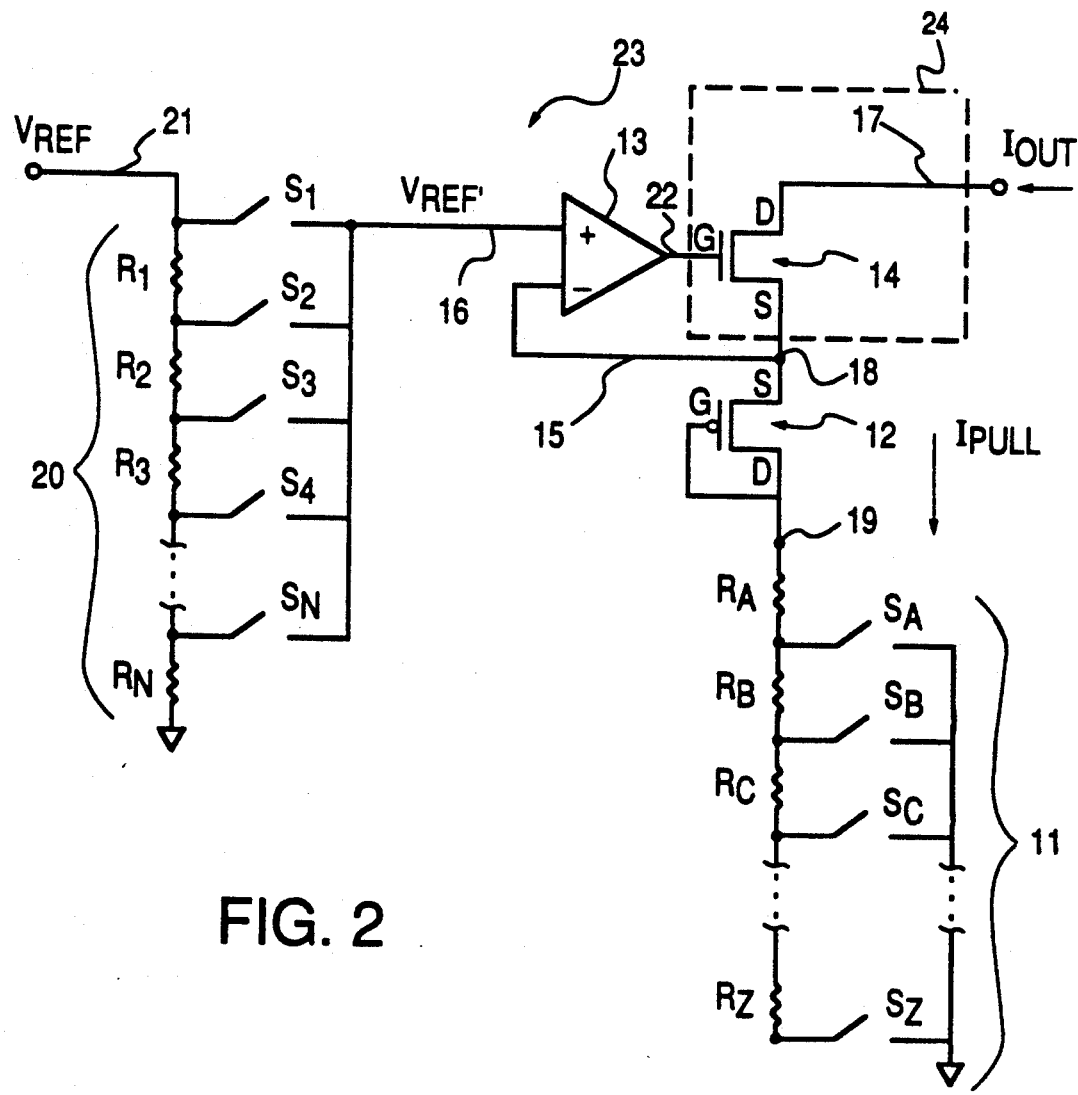
FIG. 2 illustrates a schematic of an actual embodiment of a temperature compensated voltage to current converter in accordance with the present invention which is also tunable.
Figure 3:
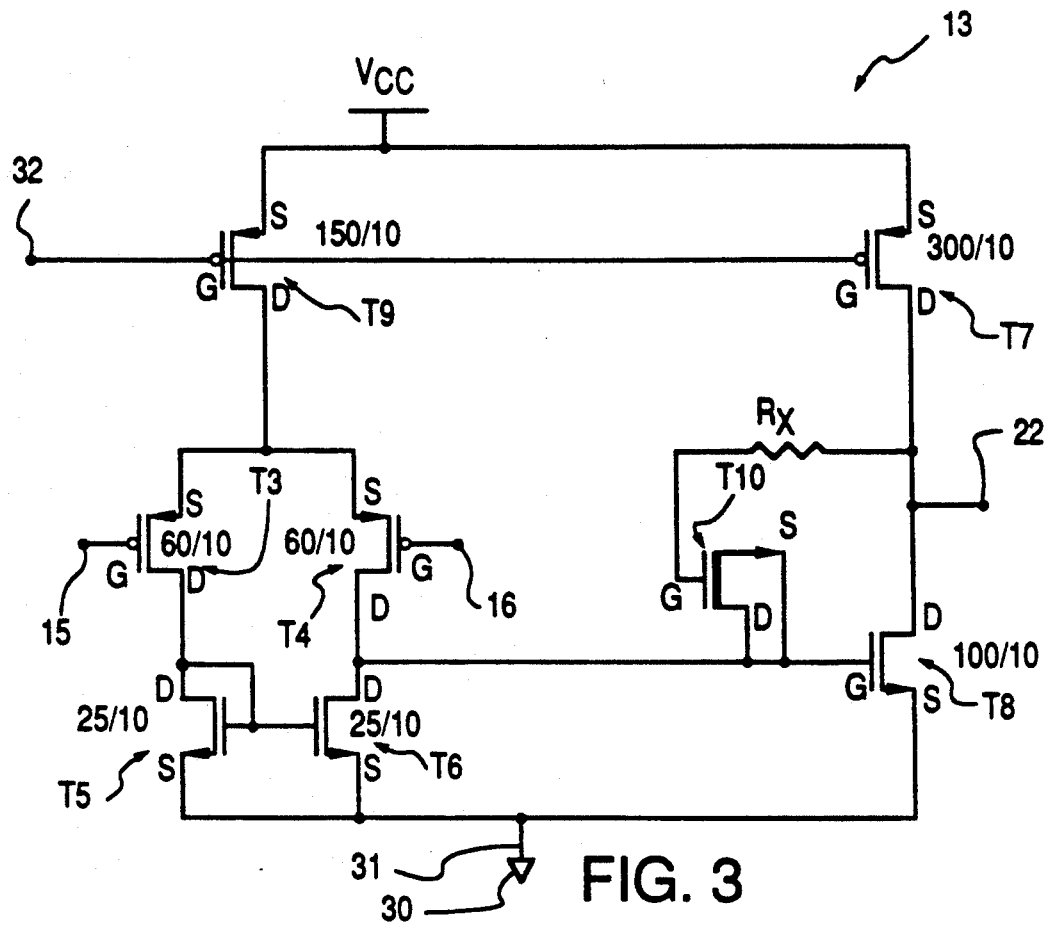
FIG. 3 shows one embodiment of an operational amplifier which is used in the present invention.

The operational amplifier 13, shown in FIG. 2, may be implemented using a circuit as set forth in FIG. 3 which illustrates the schematic of an operational amplifier 13 preferable for use with the present invention. Negative input terminal line 15 of operational amplifier 13 is connected to the gate of P-channel transistor T3, while the positive input terminal line 16 is connected to the gate of P-channel transistor T4. The input circuit of operational amplifier 13 further includes N-channel transistor T5 and N-channel transistor T6 which are connected to P-channel transistors T3 and T4, respectively. The source terminals of transistors T5 and T6 are connected to a power supply terminal 30 via conductor 31. The output circuit for operational amplifier 13 includes P-channel transistor T7 and N-channel transistor T8, with the output terminal 22 being connected to the commonly connected drains of transistors T7 and T8. A suitable bias voltage from a source (not shown) is applied to terminal 32 which is connected to the gates of P-channel transistors T7 and T9. The source terminals of transistors T7 and T9 are commonly connected, to positive supply voltage $V_{cc}$. The output circuit for operational amplifier 13 includes a frequency stabilization network comprised of resistor Rx and depletion mode transistor T10. As is well known to those skilled in the art, a depletion mode transistor with commonly connected source and drain (as shown for T10), functions as a capacitor. Resistor Rx couples the gate of transistor T10 to the commonly connected drains of transistors T7 and T8. The channel width to length ratio which is preferred for the transistors in operational amplifier 13 are indicated adjacent to each of the transistors. Operational amplifier 13 operates in a fashion well known to those skilled in the art and the explanation of its operation is accordingly not necessary.

Figure 5:
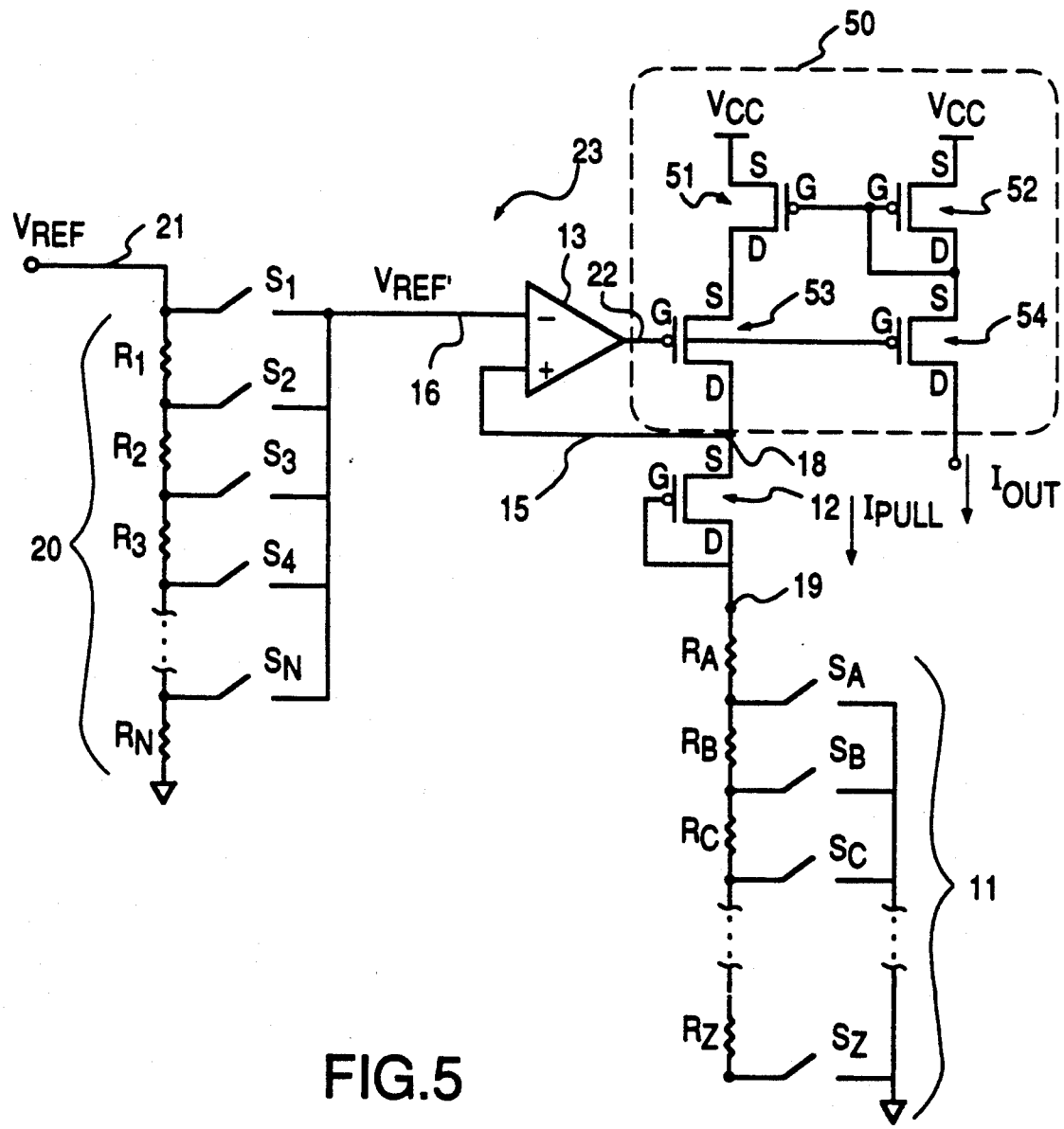
FIG. 5 shows a schematic of another actual embodiment of a converter which provides sourcing current instead of sinking current.

FIG. 2 illustrates the output line 22 of operational amplifier 13 connected to the control gate G of N-channel transistor 14. In this manner, transistor 14 responds to a control voltage by sourcing a current ($I_{PULL}$) into transistor 12 and the impedance network 11 connected between node 18 and ground which provides a predetermined voltage on node 18 (which will later be described in detail). In an alternative embodiment, a P-channel transistor network 50, as shown in FIG. 5, replaces N-channel transistor 14 which is part of network 24 (see FIG. 2). Transistor network 50, a P-channel current mirror, comprises P-channel transistors 51, 52, 53, and 54. As shown in FIG. 5, the gates G of transistors 51 and 52 are commonly connected, as are the gates G of transistors 53 and 54. The source S of transistors 51 and 52 are connected to voltage source $V_{CC}$, whereas drains D of transistors 51 and 52 are connected to the sources S of transistors 53 and 54. The drain of transistor 53 is coupled to node 18, whereas the drain of transistor 54 provides the output current $I_{OUT}$. The gate G of transistor 52 is shortened to its respective drain D. Note that in this configuration that line 15 which provides a feedback signal from node 18 to operational amplifier 13 is now connected to the positive input terminal, not the negative input terminal. In other words, N-channel transistor 14, shown in FIG. 2, provides a "current sink" which "pulls" the current. In contrast, the P-channel transistor network 50, shown in FIG. 5, provides a current source which "pushes" the current. Hence, depending upon which type of transistor is used, the appropriate input terminal to operational amplifier 13 is connected to feedback line 15. Operation of network 50 is well-known in the art and, therefore, is not described in detail.

Figure 6:
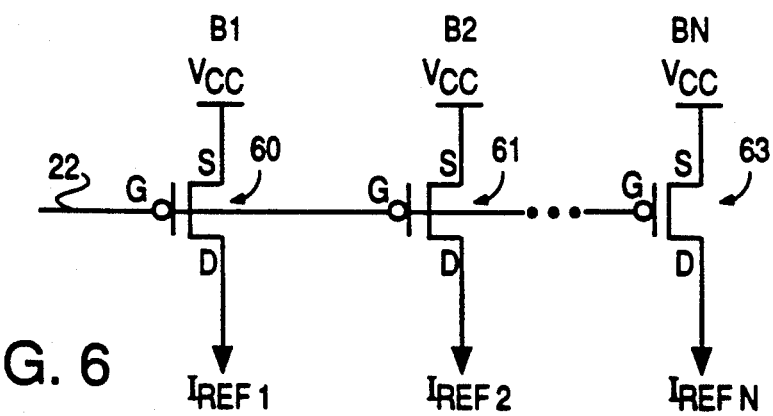
FIG. 6 illustrates a transistor network in a simple current mirror configuration.
Figure 7:
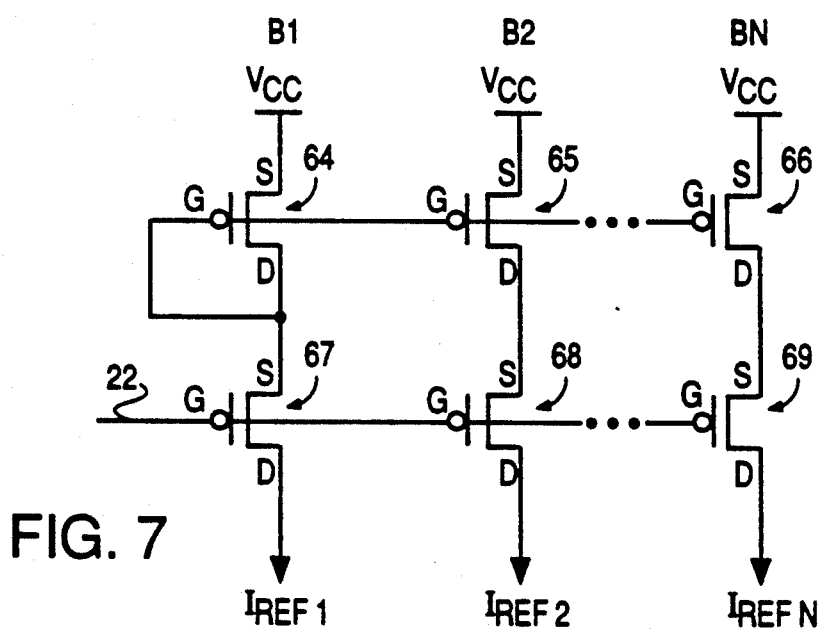
FIG. 7 shows a transistor network in a cascode current mirror configuration.
Figure 8:
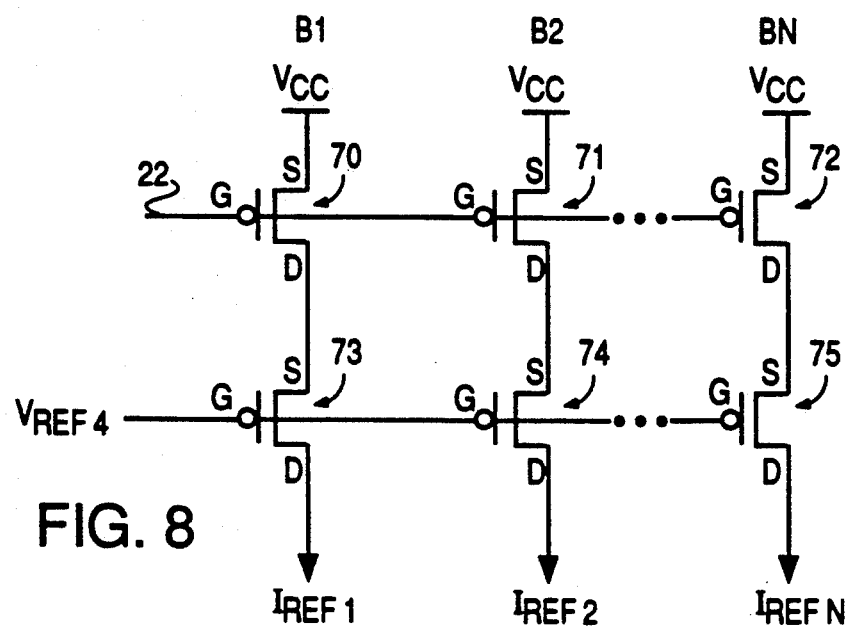
FIG. 8 illustrates a transistor network in a modified cascode current mirror configuration.

Additional embodiments of network 50 are shown in FIGS. 6-8. Specifically, FIG. 6 illustrates a typical current mirror configuration, FIG. 7 shows a cascode current mirror, while FIG. 8 illustrates a modified cascode current mirror. In FIG. 6, all gates G of transistors 60, 61, 62 are connected to receive the voltage on line 22 (see also FIG. 5). The sources S of all transistors are connected to the voltage source $V_{CC}$. Similarly to the transistor network 50 shown in FIG. 5, the current mirror configuration provides multiple reference currents $I_{REF1}$, $I_{REF2}$ ... $I_{REFN}$ (where N is the Nth current branch). Note all current branches B1, B2 ... BN are structurally identical.

As shown in FIG. 7, the gates G of transistors 64, 65, 66 are commonly connected, as are the gates G of transistors 67, 68, 69. The sources S of transistors 64, 65, 66 are connected to voltage source $V_{CC}$, whereas drains D of transistors 64, 65, 66 are connected to the sources S of transistors 67, 68, 69 respectively. The gate G of transistor 64 is shorted to its respective drain D. Line 22 provides a voltage to gate G of transistor 67. Each drain D of transistors 67, 68, 69 provides an output reference current $I_{REF1}$, $I_{REF2}$, ... $I_{REFN}$, respectively. Subsequent current branches to branch B1 reflect the configuration of branch B2.

Finally, in the modified cascode current mirror, all gates G of transistors 70, 71, 72 are connected to receive the voltage on line 22. The sources S of transistors 70, 71, 72 are connected to voltage source $V_{CC}$, whereas drains D of transistors 70, 71, 72 are connected to the respective sources S of transistors 73, 74, 75. The gates G of transistors 73, 74, 75 are commonly connected to receive a reference voltage $V_{REF4}$. The drains of these transistors provide reference currents $I_{REF1}$, $I_{REF2}$ ... $I_{REFN}$. Current branches B1, B2 ... BN are identical in configuration. The operation of each of the above-described transistor networks is well-known in the art and, as a result, is not further described.

Compensating For Processing Variations

Figure 1:
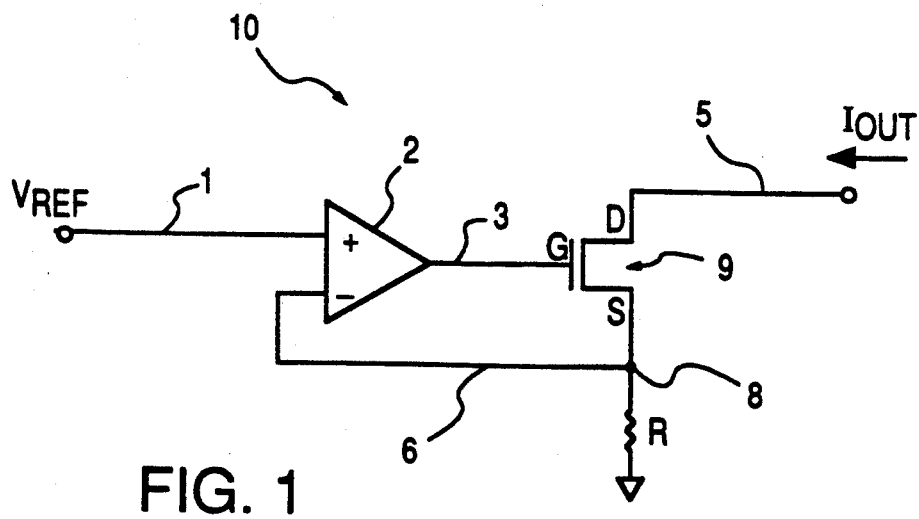
FIG. 1 shows a schematic of a simple circuit to accomplish voltage to current conversion which provides for buffering of a reference voltage.

To tune the magnitude of the resistance to account for processing, taps are programmed in impedance network 11 as shown in FIG. 2 (which takes the place of resistor R in FIG. 1).

Note that in general overview two types of impedance networks are used in the present invention. The first impedance network, termed a tapped resistive voltage divider network, as shown in FIG. 9B, provides for inputting two voltages and outputting a third voltage with a value between the values of the two input voltages. Resistors $R_{D1}$-$R_{DN}$ (where N is the total number of resistors in the network) connect the two voltage sources $V_1$ and $V_2$. Switches $S_{D0}$-$D_{DN}$ are programmably switchable to vary the output voltage $V_{OUT}$. The total possible resistance of the network $R_{TOTAL}$ is equal to the sum of all resistors $R_{D1}$-$R_{DN}$. For a given closed switch $S_{Di}$ (where $0 \leq i \leq N$), the resistance of the network is $$R_S = R_{D1} + R_{D2} + R_{D3} + \ldots R_{Di}$$

while the output voltage is provided by the equation below.

$$V_{out} = V_1 - R_S \left( \frac{V_1 - V_2}{R_{TOTAL}} \right)$$

An equivalent tapped resistive voltage divider network is functionally represented by a dashed box 113 with an arrow pointing to a resistor as shown in FIG. 9A.

The second impedance network, termed a tapped resistor network and shown in FIG. 10B, has resistors $R_{S1}$-$R_{SZ}$ (where Z is the total number of resistors in the network) coupled between points A and B. Switches $S_{S0}$-$S_{SZ}$ are programmably switchable to vary the resistance $R_{AB}$ provided by the network. The total possible resistance of the network is the sum of all resistors $R_{S1}$-$R_{SZ}$. For a given closed switch $S_i$, the resistance provided by the network is:

$$R_{AB} = R_{S1} + R_{S2} + R_{S3} + \ldots R_{Si}$$

An equivalent tapped resistor network is functionally represented by a dashed box 114 with an arrow passing through a resistor as shown in FIG. 10A.

Referring back to FIG. 2, impedance network 11, a tapped resistor network as described above, includes series-connected, polysilicon resistors $R_A$, $R_B$, $R_C$ to $R_Z$ (where Z is the total number of resistors in the series). Resistors $R_B$, $R_C$ to $R_Z$ are programmably connected to ground by switches $S_A$, $S_B$ to $S_Z$, respectively (where Z is equal to the total number of switches in impedance network 11). In other words, the closed switch shorts the associated node in impedance network 11 to ground, thereby altering the total resistance between node 19 and ground. In one embodiment of the present invention, switching is accomplished using EEPROM cells to control the state of pass gates which act as switches $S_A$-$S_Z$.

Figure 4:
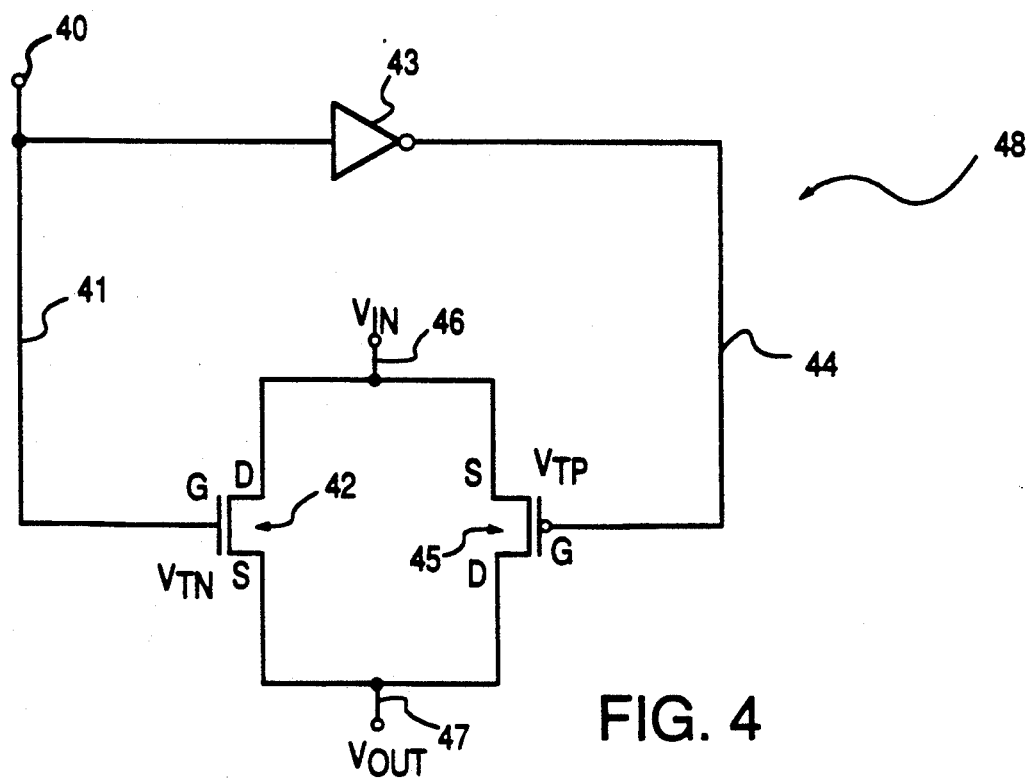
FIG. 4 illustrates a typical passgate used in the present invention.

FIG. 4 illustrates a typical pass gate 48 well-known in the art. A control signal provided on node 40, is applied to the gate G of n-channel transistor 42 via line 41. Inverter 43 inverts this signal, and transfers the new signal to the gate G of transistor 45 via line 44. This configuration ensures that both transistors 42 and 45 are both "on" or both "off". If transistors 42 and 45 are "on", then the output voltage $V_{OUT}$ is equal to $V_{IN}$. On the other hand, if transistors 42 and 45 are "off", then $V_{OUT}$ is not driven by $V_{IN}$ (i.e. the switch becomes a high impedance). Because the particular configuration of impedance network 11 (See FIG. 2) has switches $S_A$-$S_Z$ switchably connected to ground (i.e. line 47 as shown in FIG. 4 is connected to ground), transistor 45 and inverter 43 are eliminated in the preferred embodiment. In other words, switches $S_A$-$S_Z$ would be implemented using N-channel transistors with their sources connected to ground.

Using EEPROM cells to control switches $S_A$-$S_Z$ enables the user to reprogram the impedance. Other programmable elements used to control switches $S_A$-$S_Z$ may include: erasable programmable read-only memory cells, static random access memory cells, polysilicon fuses, antifuses, or laser-trimmed elements. Note that the resistances of the pass gates that act as switches $S_A$-$S_Z$ are made negligible compared to the linear resistors $R_A$-$R_Z$. Furthermore, at most, one switch is closed at any one time.

Figure 11:
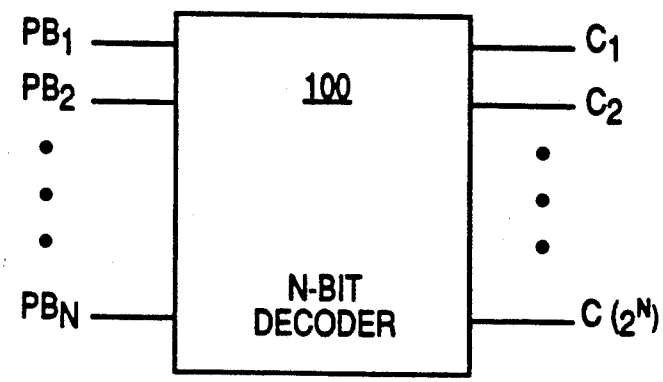
FIG. 11 shows an N-bit decoder as used in one embodiment to control switches in at least one tapped network of the present invention.

In another embodiment of the invention, decoder circuitry is provided to conserve the number of memory bits required for switching. The use of decoder circuitry becomes increasingly relevant as the number of switches increases. As shown in FIGS. 9 and 10, switches $S_{D0}$-$S_{DN}$ and $S_{S0}$-$S_{SZ}$ are controlled by control signals $C_{D0}$-$C_{DN}$ and $C_{S0}$-$C_{SZ}$, respectively, each control signal being provided by a programmable bit (not shown). An N-bit decoder 100, i.e. configured with N programmable bits ($PB_1$, $PB_2 \ldots PB_N$), as schematically illustrated in FIG. 11 provides $2^N$ control signals. For example, if there are five programmable bits available, a 5-bit decoder provides $2^5$ or 32 control signals. Hence, a decoder dramatically reduces the number of programmable bits required to control switches in the tapped networks. The implementation of a 5-bit decoder is well-known in the art, and therefore will not be explained in detail. Note that decoder circuitry applies to any tapped, adjusted, or switched network which is present in the present invention.

Compensating for Temperature Coefficients

Referring back to FIG. 1, resistor R increases in value over a predetermined temperature range. Therefore, as shown in equation 1 below, in order to maintain a constant $I_{OUT}$, the corresponding reference voltage $V_{REF}$ must also increase over that same predetermined temperature range.

$$I_{OUT(T)} = V_{REF(T)} / R_{(T)} \quad \text{(Eq. 1)}$$

In other words, in order to produce a current with a small temperature coefficient, the reference voltage $V_{REF}$ across the resistor R must have a positive temperature coefficient to cancel a positive temperature coefficient of resistor R.

One way to generate a reference voltage $V_{REF}$ with a positive temperature coefficient is to subtract a voltage with a negative temperature coefficient from a constant voltage. The threshold voltage of an MOS enhancement transistor has such a negative temperature coefficient. Therefore, as seen in FIG. 2, P-channel transistor 12 (the enhancement transistor) is coupled between the negative input terminal of operational amplifier 13 via line 15 and impedance network 11.

Connecting the gate G of transistor 12 to its drain D produces the following voltage relationship:

$$V_{DS} = V_{GS} \quad \text{(Eq. 2)}$$

where $V_{DS}$ is the drain to source voltage and $V_{GS}$ is the gate to source voltage.

However, the objective of the particular configuration of transistor 12 is to have $V_{GS}$ equal to its threshold voltage $V_{TP}$, i.e. to have transistor 12 barely "on". In this manner, the voltage across transistor 12, $V_{DS}$, equals the threshold voltage $V_{TP}$. The following equation for drain to source current, $I_{DS}$, holds true for a transistor in saturation:

$$I_{DS} = \left(\frac{\mu C_{ox}}{2}\right)\left(\frac{W}{L}\right)(V_{GS} - V_{TP})^2 \quad \text{(Eq. 3)}$$

where $\mu$ is a constant representing hole and electron mobility, $C_{ox}$ is a constant of the gate oxide capacitance per unit area, and W/L is the width to length ratio of transistor 12.

Solving for $V_{GS}$ yields the equation:

$$V_{GS} = \sqrt{\left(\frac{2}{\mu C_{ox}}\right)\left(\frac{I_{DS} L}{W}\right)} + V_{TP} \quad \text{(Eq. 4)}$$

In this manner, it is clear that voltage $V_{GS}$ will be approximately equal to voltage $V_{TP}$ if the square root term is small. However, because $\mu$ and $C_{ox}$ are constants, only the current $I_{DS}$, the length L of transistor 12, and the width W of transistor 12 can be varied. The preferred method of minimizing these variables is to provide a large W/L for transistor 12 with a small current $I_{DS}$. In one embodiment, the width and length ratio of transistor 12 is 800/4. A reasonable benchmark target for the product of these terms is given below.

$$\frac{I_{DS} L}{W} \approx 100 \times 10^{-9} A \quad \text{(Eq. 5)}$$

Under the above conditions, node 19 has a voltage $V_{TUNE}$ equal to the reference voltage $V_{REF}$ (note similarity of node 18 in FIG. 2 to node 8 in FIG. 1) plus the threshold voltage of P-channel transistor 12.

$$V_{TUNE(T)} = V_{REF(T)} + V_{TP(T)} \quad \text{(Eq. 6)}$$

In this manner, the effect of the temperature coefficient of both the input reference voltage $V_{REF}$ and impedance network 11 is canceled by the temperature coefficient of the P-channel transistor threshold voltage.

For further appreciation of the voltages appearing at various nodes in the circuit of FIG. 2, the following table is provided in which the left hand column indicates the baseline threshold voltages for P-channel devices and polycrystalline silicon resistance; and the right hand column indicates the corresponding temperature coefficients for both elements in the left hand column.

|        | Typical Absolute Values | Approximate Temperature Coefficients |
|--------|-------------------------|--------------------------------------|
| Poly R | 25 ohms/□               | +0.00085 parts/C°                    |
| $V_{TP}$ | −0.9 V                | −0.0016666 parts/C°                  |

Figure 12A:
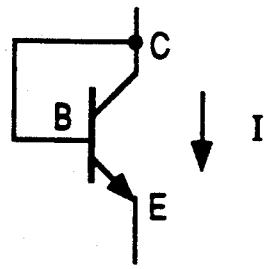
FIGS. 12A-12D illustrate typical configurations of bipolar transistors used at the voltage offset stage.
Figure 12B:
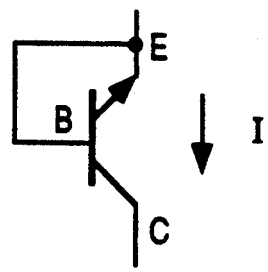
Figure 12C:
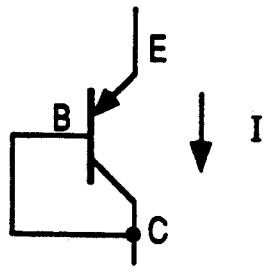
Figure 12D:
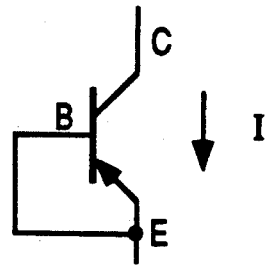

In another embodiment of the present invention, a bipolar transistor replaces P-channel transistor 12. Various bipolar transistor configurations are illustrated in FIGS. 12A–12D. Specifically, FIG. 12A shows an NPN Base-Emitter Diode, FIG. 12B an NPN Base-Collector Diode, FIG. 12C a PNP Base-Emitter Diode, and FIG. 12D shows a PNP Base-Collector Diode. As is well known in the art, the base-to-emitter voltage of a bipolar transistor has less dependence on current than a gate-to-source voltage of an MOS transistor. In particular, the base-emitter voltage $V_{BE}$ of a bipolar is proportional to the natural logarithm of the collector-to-emitter current ($V_{BE} \propto \ln(I_{CE})$), while the gate-to-source voltage $V_{GS}$ of a typical MOS transistor is proportional to the threshold voltage $V_T$ plus the square root the drain-to-source current divided by a constant $\beta$ $$\beta \left( V_{GS} \propto V_T + \sqrt{\frac{I_{DS}}{\beta}} \right).$$

Therefore, in general, the $V_{BE}$ voltage of a bipolar transistor is substantially more "constant" than the $V_{GS}$ voltage of an MOS transistor over a given broad range of operating current levels.

To tune the temperature coefficient of the circuit to zero, the magnitude of the reference voltage $V_{REF}$ must also be adjusted using impedance network 20 as illustrated in FIG. 2 (see also tapped resistor voltage divider network shown in FIG. 9). Impedance network 20 comprises n-well series connected resistors $R_1$-$R_N$ (where N is the total number of switches in impedance network 20) switchably connected to line 16. Switches $S_1$-$S_N$, like $S_A$-$S_Z$, are implemented using pass gates (see FIG. 4).

Figure 13A:
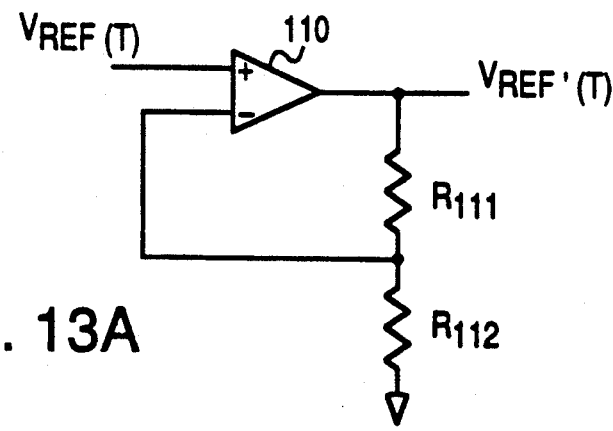
FIGS. 13A-13E show typical operational amplifier configurations used to provide a variable voltage gain stage.
Figure 13B:
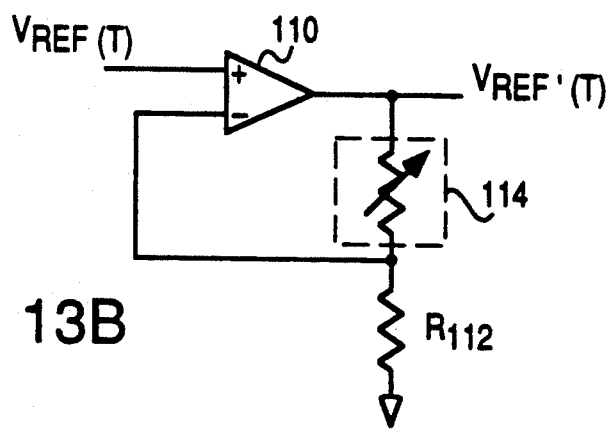
Figure 13C:
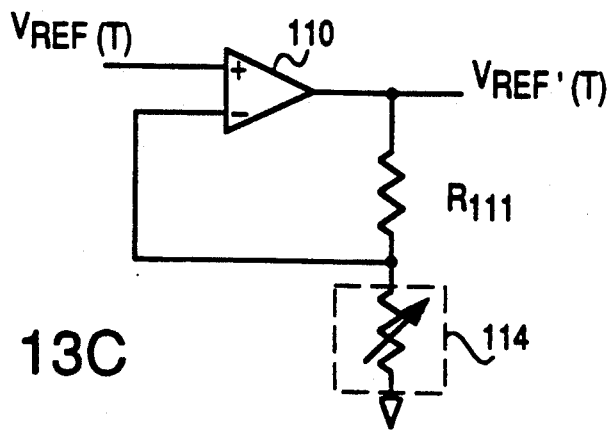

In another embodiment of the present invention, impedance network 20 is replaced with an active voltage gain stage. FIG. 13A illustrates a simple active voltage gain stage. Operational amplifier 110, in conjunction with resistors $R_{111}$ and $R_{112}$ form a network which is capable of providing a voltage gain greater than one (1). As illustrated in FIGS. 13B and 13C, resistors $R_{111}$ and $R_{112}$ have been replaced with tapped resistor network 114 respectively, to provide a variable gain. A tapped resistor network is described in detail in reference to FIGS. 10A and 10B. In another embodiment (not shown), both resistors $R_{111}$ and $R_{112}$ are replaced with tapped resistor networks. In reference to FIG. 13A, the following equation holds true.

$$V_{Ref(T)} = \left( \frac{R_{111} + R_{112}}{R_{112}} \right) V_{Ref(T)}$$

Figure 13D:
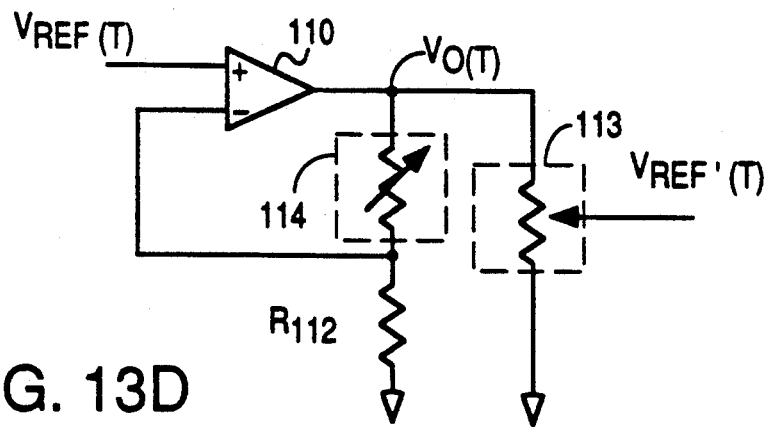

FIG. 13D illustrates another embodiment including an operational amplifier which includes the tapped resistor network 114 (see FIG. 13B), as well as a tapped resistive voltage divider network 113 to provide an output voltage $V_{REF(T)}$ which can be tuned for gains both greater than or less than one (1), with respect to $V_{REF(T)}$. Note a tapped resistive voltage divider network is described in detail in reference to FIGS. 9A and 9B.

In reference to FIG. 13D, the following equations hold true:

$$V_{O(T)} = K_1 V_{REF(T)}$$

and $$V_{REF(T)} = K_2 V_{o(T)}$$

where $K_1$ is a constant ($1 \leq K_1 \leq \infty$) and $K_2$ is a constant ($0 \leq K_2 \leq 1$).

Therefore, it follows that:

$$V_{REF(T)} = (K_2 K_1) V_{REF(T)}$$

Hence, by setting the two constants $K_1$ and $K_2$, an effective gain of either greater than or less than one (1) may be achieved.

Figure 13E:
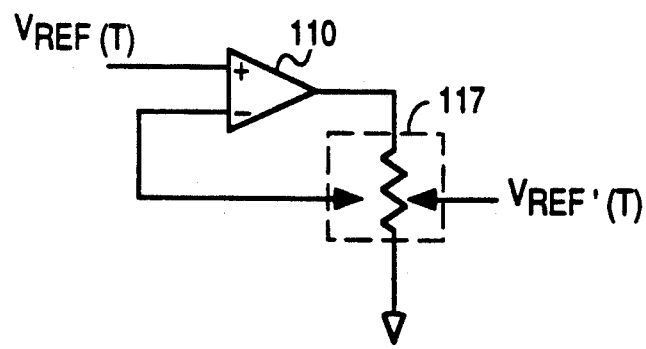

A multi-tapped resistive voltage divider network 117, as illustrated in FIG. 13E, also provides a voltage gain greater than or less than one (1). Utilizing two independent taps allows for the feedback voltage to the operational amplifier to be adjusted independent of the output voltage tap setting. This configuration achieves the same functionality of FIG. 13D with reduced component count. Implementation of a multi-tapped resistive voltage divider network is well-known in the art, and therefore is not described in detail.

Figure 14:
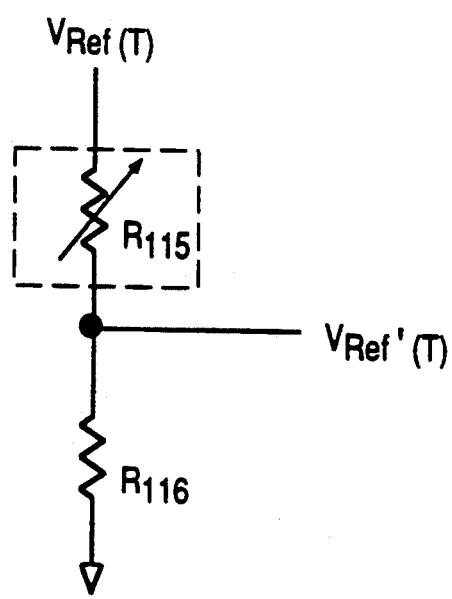
FIG. 14 illustrates a tapped resistive voltage divider network that includes at least one laser-trimmed resistor.

In yet another embodiment, impedance network 20 includes at least one resistor which is laser-trimmed, thereby providing a voltage gain which is also less than or equal to one (1). FIG. 14 illustrates one embodiment using laser-trimming of resistor R115. In other embodiments, resistor $R_{116}$ is laser-trimmed or both resistors $R_{115}$ and $R_{116}$ are laser trimmed. In any embodiment, the relationship of the input to output voltage remains:

$$V_{Ref(T)} = \left( \frac{R_{116}}{R_{115} + R_{116}} \right) V_{Ref(T)}$$

Because these embodiments are well-known in the art, a detailed description is not provided herein.

Note that current $I_{OUT}$ will be determined now by the following elements: the reference voltage $V_{REF}$ as it is modified by impedance network 20; the threshold voltage $V_{TP}$ of transistor 12 which varies as a function of temperature; and a resistance provided by impedance network 11 which also varies as a function of temperature.

The magnitude of the current, $I_{OUT}$, including the effects of temperature coefficient cancellation, is expressed in Equation 7 below, $$I_{OUT(T)} = \frac{K_1 V_{REF}(1 + \alpha_0 T) + V_{TP}(1 + \alpha_1 T)}{K_2 R_{REF}(1 + \alpha_2 T)} \quad \text{(Eq. 7)}$$

where $K_1$ is the ratio of the reference voltage $V_{REF}$. For example, if switch $S_2$ of impedance network 20 were programmed closed, the following equation would represent $K_1$:

$$K_1 = \frac{R_2 + R_3 + \ldots R_N}{R_1 + R_2 + \ldots R_N} \quad \text{(Eq. 8)}$$

Note that:

$$V_{REF(T)} = K_1 V_{REF(T)} \quad \text{(Eq. 9)}$$

Also referring to Equation 7, $R_{REF}$ is equivalent to all resistors included in impedance network 11. Hence, $$R_{REF} = R_A + R_B + \ldots R_Z \quad \text{(Eq. 10)}$$

Constant $K_2$, like $K_1$, is determined as a function of which of the switches $S_A$-$S_Z$ are programmed closed. Therefore, assuming for example that switch $S_B$ is closed, constant $K_2$ is represented by the equation below:

$$K_2 = \frac{R_A + R_B}{R_{REF}} \quad \text{(Eq. 11)}$$

Note that constant $K_2$, like constant $K_1$, is also always less than or equal to 1.

In further reference to Equation 7, $\alpha_0$ is the temperature coefficient of the input reference voltage, $\alpha_1$ is the temperature coefficient of the p-channel transistor threshold voltage $V_{TP}$, and $\alpha_2$ is the temperature coefficient of $R_{REF}$.

Using the value of $V_{TUNE}$ (as redefined below)

$$V_{TUNE(T)} = V_{REF(T)} + V_{TP(T)} = K_1 V_{REF(T)} V_{TP(T)} \quad \text{(Eq. 12)}$$

and defining the term $\beta$ as:

$$\beta = \frac{\alpha_0 V_{REF} + \alpha_1 V_{TP}}{V_{REF} + V_{TP}} \quad \text{(Eq. 13)}$$

allows Equation 7 to be rewritten as:

$$I_{OUT(T)} = \frac{V_{TUNE}(1 + \beta T)}{K_2 R_{REF}(1 + \alpha_2 T)} \quad \text{(Eq. 14)}$$

As can be seen from the equation above, when $\beta$ equals $\alpha_2$, current $I_{OUT}$ has a zero temperature coefficient.

If $\beta = \alpha_2$, then using equation 13 yields the equation:

$$\left( \frac{\alpha_0 V_{REF} + \alpha_1 V_{TP}}{V_{TUNE}} \right) = \alpha_2 \quad \text{(Eq. 15)}$$

Solving for $V_{TUNE}$ and using equation 12 yields:

$$\left( \frac{\alpha_0 V_{REF} + \alpha_1 V_{TP}}{\alpha_2} \right) = V_{TUNE} = V_{REF} + V_{TP} \quad \text{(Eq. 16)}$$

Solving for $V_{REF}$ (which is $K_1 V_{REF}$) yields:

$$\frac{\alpha_1 V_{TP}}{\alpha_2} - V_{TP} = V_{REF} - \frac{\alpha_0 V_{REF}}{\alpha_2} \quad \text{(Eq. 17)}$$

Equation 17 simplifies to, $$\frac{(\alpha_1 - \alpha_2) V_{TP}}{(\alpha_2)} = \frac{(\alpha_2 - \alpha_0) V_{REF}}{\alpha_2} \quad \text{(Eq. 18)}$$

which further simplifies to, $$\frac{(\alpha_1 - \alpha_2)}{(\alpha_2 - \alpha_0)} V_{TP} = V_{REF} = K_1 V_{REF} \quad \text{(Eq. 19)}$$

Exemplary values may be as follows: $V_{TP} = -0.8$, $\alpha_0 = 0.0002$, $\alpha_1 = -0.00166$, and $\alpha_2 = 0.00085$. Using equation 19, yields a $K_1 V_{REF}$ equal to 3.09 V (which is equal to $V_{REF}$). In accordance with the present invention, a realizable solution for voltage $V_{REF}$ is possible with appropriate temperature coefficients. Specifically, temperature coefficients are dependent on components currently existing in integrated circuit form, each component having a predetermined temperature coefficient. Hence, when a particular voltage $V_{REF}$ is desired, the user is logically limited by available components which will provide the appropriate temperature coefficients.

Hence, as demonstrated above, constant $K_1$ is used to adjust reference voltage $V_{REF}$ to achieve a zero temperature coefficient. Constant $K_2$, on the other hand, is used to adjust the magnitude of the output current $I_{OUT}$ in accordance with the equation below.

$$I_{OUT} = \frac{K_1 V_{REF} + V_{TP}}{K_2 R_{REF}} \quad \text{(Eq. 20)}$$

Note that in temperature coefficient cancellation that all components are assumed to have only first order temperature coefficients. Measurements from silicon indicate that polysilicon resistors, such as $R_4$-$R_Z$, have linear temperature coefficients. Equation 7 shows that $K_1$ adjusts the magnitude of the current as well as the temperature coefficient, so $K_1$ must be adjusted first, then $K_2$ can calibrate the current to the desired value. Note that all elements having temperature coefficients should be tested at two temperatures, high and low, both before and after packaging (generally one temperature during wafer sort, and the other temperature during final assembly test). With non-volatile memory, the results of the first temperature measurement can be written to memory, with for example EEPROM cells or any other programmable elements, and then read during the second temperature test. Because of the above mentioned linear relationships, a line drawn between the two points determined by these two temperatures yields the temperature coefficient. After the temperature coefficient is tuned, the magnitude can be adjusted in one step, since the magnitude adjust ($K_2$) should have almost no effect on the overall temperature coefficient.

Hence, circuit 23 provides a constant current $I_{OUT}$ which is independent of temperature. This independence is accomplished by impedance network 20 and by P-channel transistor 12 which compensates for the temperature coefficient of both the input reference voltage $V_{REF}$ and impedance network 11. Furthermore, impedance network 11 allows circuit 23 to tune the magnitude of current $I_{OUT}$. As an additional benefit, impedance network 11 permits circuit 23 to be also independent of process.

A CMOS voltage to current converter in accordance with the present invention provides the following advantages:

1. The circuit does not require the use of either a reference voltage or a resistor with near-zero temperature coefficients. Instead, the temperature coefficients of the input reference voltage, an output resistance network (II), and a transistor threshold voltage are combined to effectively cancel each other.
2. The magnitude of the current is adjustable, and does not affect the temperature coefficient.
3. The circuit be used with external voltage source because the input reference voltage does not require a temperature coefficient.

The above description is meant to be illustrative only, and not limiting. For example, although polysilicon resistors were used in the above embodiment of the invention, other types of devices producing impedance may also be used. Furthermore, P-channel transistor 6 may be replaced with an N-channel device or other device with a suitable temperature coefficient. Further modifications of the invention will be apparent to one of ordinary skill in the art in light of this disclosure and the claims.

I claim:

1. A circuit for converting a first reference voltage to current comprising:
   means for varying a voltage gain of said first reference voltage and outputting a modified reference voltage;
   means for responding to a difference between a first voltage and a second voltage, and outputting at least one reference current, said first voltage being said modified reference voltage;
   means for providing said second voltage coupled to and receiving a first reference current of said at least one reference current, said means for providing said second voltage further coupled to a second reference voltage, said means for providing said second voltage comprising:
   means for providing a voltage offset coupled to and receiving said first reference current of said at least one reference current, wherein a magnitude of said voltage offset is substantially independent of a magnitude of said first reference current over a predetermined range of current; and
   means for providing a resistance coupled to said means for providing a voltage offset, said means for providing a resistance further coupled to said second reference voltage;
   wherein said means for providing a voltage offset exhibits a temperature coefficient of voltage and said means for providing a resistance exhibits a temperature coefficient of resistance, wherein said temperature coefficient of voltage is independent from said temperature coefficient of resistance;
   wherein said means for varying provides a linear relationship between said first reference voltage and said modified reference voltage;
   wherein said means for varying provides a constant relationship between a temperature coefficient of voltage of said first reference voltage and a temperature coefficient of voltage of said modified reference voltage;
   wherein said temperature coefficients of said voltages are substantially equal;
   wherein said means for varying comprises at least one resistor, wherein said voltage gain is controlled by adjusting the resistance of one or more of said at least one resistor.

2. The circuit of claim 1 wherein said one or more of said at least one resistor is laser-trimmed.

3. The circuit of claim 1 wherein one or more of said at least one resistor comprise a tapped resistor network with at least one tap and means for selectively setting a resistance of said network.

4. The circuit of claim 3 wherein said means for selectively setting said resistance is at least one switch.

5. The circuit of claim 4 wherein said at least one switch is a CMOS transistor pass gate.

6. The circuit of claim 4 wherein said tapped resister network further includes at least one programmable cell, said at least one switch being responsive to said at least one programmable cell.

7. The circuit of claim 6 further comprising an N-bit decoder coupled between said at least one switch and said at least one programmable cell.

8. The circuit of claim 6 wherein said programmable cell is an electrically erasable programmable read only memory (EEPROM) cell.

9. The circuit of claim 6 wherein said programmable cell is a static random access memory (SRAM) cell.

10. The circuit of claim 6 wherein said programmable cell is an erasable programmable read only memory (EPROM) cell.

11. The circuit of claim 6 wherein said programmable cell is a polysilicon fuse.

12. The circuit of claim 6 wherein said programmable cell is an anti-fuse.

13. The circuit of claim 6 wherein said programmable cell comprises a laser-programmable link.

14. A circuit for converting a first reference voltage to current comprising:
   means for varying a voltage gain of said first reference voltage and outputting a modified reference voltage;
   means for responding to a difference between a first voltage and a second voltage, and outputting at least one reference current, said first voltage being said modified reference voltage;
   means for providing said second voltage coupled to and receiving a first reference current of said at least one reference current, said means for providing said second voltage further coupled to a second reference voltage, said means for providing said second voltage comprising
   means for providing a voltage offset coupled to and receiving said first reference current of said at least one reference current, wherein a magnitude of said voltage offset is substantially independent of a magnitude of said first reference current over a predetermined range of current; and
   means for providing a resistance coupled to said means for providing a voltage offset, said means for providing a resistance further coupled to said second reference voltage;
   wherein said means for providing a voltage offset exhibits a temperature coefficient of voltage and said means for providing a resistance exhibits a temperature coefficient of resistance, wherein said temperature coefficient of voltage is independent from said temperature coefficient of resistance;
   wherein said means for varying provides a linear relationship between said first reference voltage and said modified reference voltage;
   wherein said means for varying provides a constant relationship between a temperature coefficient of voltage of said first reference voltage and a temperature coefficient of voltage of said modified reference voltage, wherein said temperature coefficients of said voltages are substantially equal;
   wherein said means for varying comprises a tapped resistor voltage divider network having at least two resistances with at least one tap for outputting said modified reference voltage, wherein said voltage gain is varied by laser-trimming one or more of said at least two resistances.

15. A circuit for converting a first reference voltage to current comprising:
   means for varying a voltage gain of said first reference voltage and outputting a modified reference voltage;
   means for responding to a difference between a first voltage and a second voltage, and outputting at least one reference current, said first voltage being said modified reference voltage;
   means for providing said second voltage coupled to and receiving a first reference current of said at least one reference current, said means for providing said second voltage further coupled to a second reference voltage, said means for providing said second voltage comprising
   means for providing a voltage offset coupled to and receiving said first reference current of said at least one reference current, wherein a magnitude of said voltage offset is substantially independent of a magnitude of said first reference current over a predetermined range of current; and
   means for providing a resistance coupled to said means for providing a voltage offset, said means for providing a resistance further coupled to said second reference voltage;
   wherein said means for providing a voltage offset exhibits a temperature coefficient of voltage and said means for providing a resistance exhibits a temperature coefficient of resistance, wherein said temperature coefficient of voltage is independent from said temperature coefficient of resistance;
   wherein said means for responding comprises:
      (a) means for comparing said first and second voltages and providing a third voltage responsive to said difference between said first and second voltages; and
      (b) means responsive to said third voltage to provide said at least one reference current;
   wherein (b) is an MOS transistor network comprising a plurality of P-channel enhancement devices.

16. The circuit of claim 15 further comprising at least a second reference current and a third reference voltage, wherein said plurality of P-channel enhancement devices comprises a first P-channel transistor, and at least a second P-channel transistor, each transistor having a gate, a source, and a drain,
   wherein said sources of said first and at least said second P-channel transistors are connected to said third reference voltage, said gates of said first and at least said second P-channel transistors are connected to receive said third voltage,
   wherein said first transistor forms a first branch, and said second transistor forms a second branch,
   wherein said first reference current said first branch, and said second reference current flows in said second branch,
   wherein subsequent branches of said circuit are similar to said second branch.

17. A circuit of claim 15 wherein said plurality of P-channel enhancement devices are in a cascode current mirror configuration,
   wherein said cascode current mirror configuration includes at least four P-channel transistors, each transistor having a drain, a source, and a gate,
   wherein said sources of said first P-channel transistor and said third P-channel transistor are connected to said third reference voltage, said gates of said first P-channel transistor and said third P-channel transistor are connected, and said gate and drain of said first P-channel transistor are connected, wherein said drain of said first P-channel transistor is connected to said source of said second P-channel transistor, and said source of said fourth P-channel transistor is connected to said drain of said third P-channel transistor, wherein said gates of said second and fourth P-channel transistors are connected to receive said third voltage, wherein said first and second transistors form a first branch, and said third and fourth transistors form a second branch, wherein said first reference current of said at lease one reference current flows in said first branch, and said second reference current flows in said second branch, wherein subsequent branches are similar in configuration to said second branch.

18. A circuit of claim 15 further comprising a fourth reference voltage, wherein said plurality of P-channel enhancement devices are in a modified cascode current mirror configuration, wherein said modified cascode current mirror configuration includes at least four P-channel transistors, each transistor having a drain, a source, and a gate, wherein said sources of said first P-channel transistor and said third P-channel transistor are connected to said third reference voltage, and said gates of said first P-channel transistor and said third P-channel transistor are connected to said third voltage, wherein said drain of said first P-channel transistor is connected to said source of said second P-channel transistor, and said source of said fourth P-channel transistor is connected to said drain of said third P-channel transistor, wherein said gates of said second and fourth P-channel transistors are connected to receive said fourth reference voltage, wherein said first and second transistors form a first branch, and said third and fourth transistors form a second branch, wherein said first reference current of said at least one reference current flows in said first branch, and said second reference current flows in said second branch, wherein subsequent branches are similar in configuration to said second branch.

19. A circuit for converting a first reference voltage to current comprising:

means for varying a voltage gain of said first reference voltage and outputting a modified reference voltage;

means for responding to a difference between a first voltage and a second voltage, and outputting at least one reference current, said first voltage being said modified reference voltage;

means for providing said second voltage coupled to and receiving a first reference current of said at least one reference current, said means for providing said second voltage further coupled to a second reference voltage, said means for providing said second voltage comprising means for providing a voltage offset coupled to and receiving said first reference current of said at least one reference current, wherein a magnitude of said voltage offset is substantially independent of a magnitude of said first reference current over a predetermined range of current; and means for providing a resistance coupled to said means for providing a voltage offset, said means for providing a resistance further coupled to said second reference voltage;

wherein said means for providing a voltage offset exhibits a temperature coefficient of voltage and said means for providing a resistance exhibits a temperature coefficient of resistance, wherein said temperature coefficient of voltage is independent from said temperature coefficient of resistance;

wherein said means for providing a voltage offset is a bipolar transistor having a base, a collector, and an emitter, said base and said collector being connected.

20. The circuit of claim 19 wherein said bipolar transistor is an NPN transistor.

21. The circuit of claim 19 wherein said bipolar transistor is a PNP transistor.

22. A circuit for converting a first reference voltage to one or more currents comprising:

means for varying a voltage gain for receiving said first reference voltage and outputting a modified reference voltage;

means for responding to a difference between a first voltage and a second voltage, and outputting at least one reference current, said first voltage being said modified reference voltage;

means for providing said second voltage coupled to and receiving a first reference current of said at least one reference current, said means for providing said second voltage further coupled to a second reference voltage, said means for providing said second voltage comprising:

means for providing a voltage offset coupled to and receiving said first reference current of said at least one reference current, wherein a magnitude of said voltage offset is substantially independent of a magnitude of said first reference current over a predetermined range of current; and means for providing a resistance coupled to said means for providing a voltage offset, said means for providing a resistance further coupled to said second reference voltage;

wherein said means for providing a voltage offset exhibits a temperature coefficient of voltage and said means for providing a resistance exhibits a temperature coefficient of resistance, wherein said temperature coefficient of voltage is independent from said temperature coefficient of resistance, wherein said means for varying provides a linear relationship between said first reference voltage and said modified reference voltage, wherein said means for varying provides a constant relationship between a temperature coefficient of voltage of said first reference voltage and a temperature coefficient of voltage of said modified reference voltage, wherein said temperature coefficients of said voltages are substantially equal, wherein said means for varying comprises a tapped resistor voltage divider network with at least one tap and means for selectively outputting said modified reference voltage, wherein said means for selectively outputting comprises a switch for each of said at least one tap,
wherein said tapped resister voltage divider network further includes at least one programmable cell, said switch being responsive to said at least one programmable cell, wherein said circuit further comprises an N-bit decoder coupled between said at least one switch and said at least one programmable cell.

23. A circuit for converting a first reference voltage to one or more currents comprising:
means for varying a voltage gain for receiving said first reference voltage and outputting a modified reference voltage;
means for responding to a difference between a first voltage and a second voltage, and outputting at least one reference current, said first voltage being said modified reference voltage;
means for providing said second voltage coupled to and receiving a first reference current of said at least one reference current, said means for providing said second voltage further coupled to a second reference voltage, said means for providing said second voltage comprising
means for providing a voltage offset coupled to and receiving said first reference current of said at least one reference current, wherein a magnitude of said voltage offset is substantially independent of a magnitude of said first reference current over a predetermined range of current; and
means for providing a resistance coupled to said means for providing a voltage offset, said means for providing a resistance further coupled to said second reference voltage;
wherein said means for providing a voltage offset exhibits a temperature coefficient of voltage and said means for providing a resistance exhibits a temperature coefficient of resistance, wherein said temperature coefficient of voltage is independent from said temperature coefficient of resistance,
wherein said means for providing a resistance comprises means for varying the value of said resistance,
wherein said means for varying the value of said resistance comprises a tapped resistor network with at least one tap and means for selectively coupling said tap to said second reference voltage,
wherein said means for selectively coupling comprises a switch for each of said at least one tap,
wherein said tapped resister network further includes at least one programmable cell, said switch being responsive to said at least one programmable cell,
wherein said circuit further comprises an N-bit decoder coupled between said at least one switch and said at least one programmable cell.

24. A method for converting a temperature-dependent, constant voltage to at least one temperature-independent current comprising:
inputting said temperature-dependent, constant voltage to a circuit;
outputting from said circuit a temperature-dependent variable voltage having a first predetermined temperature coefficient of voltage across a resistance having a second predetermined temperature coefficient of resistance; and
varying a magnitude of said temperature-dependent variable voltage by varying a means for varying a voltage which receives said temperature independent constant voltage until said first predetermined temperature coefficient of voltage compensates for said second predetermined temperature coefficient of resistance to provide said temperature independent current.

25. The method of claim 24 wherein outputting said temperature-dependent variable voltage includes the steps of:
(a) providing a first reference current with a differential voltage to current converter, said first reference current being one of said at least one temperature-independent current, and being dependent on a difference in a first input voltage and a second input voltage;
(b) producing said first input voltage by adjusting a means for varying a voltage coupled to said temperature-dependent, constant voltage; and
(c) producing said second input voltage across a series connected voltage offset stage and said resistance in response to said first reference current, said voltage offset stage exhibiting a temperature-dependent voltage offset with substantially no dependence on current.

26. The method of claim 25 wherein said means for varying a voltage comprises a resistive voltage divider network having a controllable divide ratio.

27. The method of claim 26 wherein step (b) includes controlling said controllable divide ratio of said resistive voltage divider network with electrically programmable cells.

28. The method of claim 26 wherein step (b) includes controlling said controllable divide ratio of said resistive voltage divider network with laser programmable links.

29. The method of claim 26 wherein step (b) includes controlling said controllable divide ratio of said resistive voltage divider network by laser-trimming one or more resistor values.

30. The method of claim 25 wherein said means for varying a voltage comprises a voltage gain stage having a controllable gain factor.

31. The method of claim 30 wherein step (b) includes controlling said controllable gain factor of said voltage gain stage with electrically programmable cells.

32. The method of claim 30 wherein step (b) includes controlling said controllable gain factor of said voltage gain stage with laser programmable links.

33. The method of claim 30 wherein step (b) includes controlling said controllable gain factor of said voltage gain stage by laser-trimming one or more resistor values.

34. The method of claim 25 further including providing one or more additional temperature-independent currents derived from said first reference current.

35. The method of claim 34 wherein said providing includes independently setting the magnitude of each of said one or more additional temperature independent currents to predetermined multiples of said first reference current.

36. The method of claim 25 wherein said series connected voltage offset stage includes operating an MOS transistor at its turn-on threshold value.

37. The method of claim 25 wherein said series connected voltage offset stage includes a bipolar transistor connected in a diode configuration.

38. The method of claim 24 further comprising the step of:

adjusting the magnitude of the first of said at least one temperature-independent current by varying the value of said resistance.

39. The method of claim 38 wherein said varying includes controlling said value of said resistance with electrically programmable cells.

40. The method of claim 38 wherein said varying includes controlling said value of said resistance with laser programmable links.

41. The method of claim 38 wherein said varying includes controlling said value of said resistance by laser-trimming.

* * * * *